United States Patent
Shih et al.

(10) Patent No.: US 8,530,344 B1
(45) Date of Patent: Sep. 10, 2013

(54) METHOD FOR MANUFACTURING FINE-PITCH BUMPS AND STRUCTURE THEREOF

(75) Inventors: Cheng-Hung Shih, Changhua County (TW); Yung-Wei Hsieh, Hsinchu (TW); Shu-Chen Lin, Pingtung County (TW); Cheng-Fan Lin, Hsinchu County (TW); Hua-An Dai, Kaohsiung (TW)

(73) Assignee: Chipbond Technology Corporation, Hsinchu (TW)

( * ) Notice: Subject to any disclaimer, the term of this patent is extended or adjusted under 35 U.S.C. 154(b) by 0 days.

(21) Appl. No.: 13/426,857

(22) Filed: Mar. 22, 2012

(51) Int. Cl.
*H01L 21/44* (2006.01)

(52) U.S. Cl.
USPC .................................................. 438/612

(58) Field of Classification Search
USPC ............... 438/612–615, 648, 652, 656, 674, 438/685, 687
See application file for complete search history.

(56) References Cited

U.S. PATENT DOCUMENTS

| | | | |
|---|---|---|---|
| 2001/0040290 A1* | 11/2001 | Sakurai et al. | 257/737 |
| 2004/0087131 A1* | 5/2004 | Brintzinger et al. | 438/614 |
| 2004/0166661 A1* | 8/2004 | Lei | 438/614 |
| 2009/0020322 A1* | 1/2009 | Hsu | 174/257 |

* cited by examiner

*Primary Examiner* — Steven Loke
*Assistant Examiner* — Mouloucoulaye Inoussa
(74) *Attorney, Agent, or Firm* — Jackson IPG PLLC

(57) ABSTRACT

A method for manufacturing fine-pitch bumps comprises providing a silicon substrate; forming a titanium-containing metal layer having a plurality of first zones and a plurality of second zones on the silicon substrate; forming a photoresist layer on the titanium-containing metal layer; patterning the photoresist layer; forming a plurality of copper bumps having a plurality of first top surfaces and a plurality of first ring surfaces; heating the photoresist layer to form a plurality of body portions and removable portions; etching the photoresist layer; forming a plurality of bump protection layers on the titanium-containing metal layer, the first top surface and the first ring surface, each of the bump protection layers comprises a bump coverage portion; plating a plurality of gold layers at the bump coverage portion; eventually, removing the second zones to enable each of the first zones to form an under bump metallurgy layer.

7 Claims, 7 Drawing Sheets

METHOD FOR MANUFACTURING FINE-PITCH BUMPS AND STRUCTURE THEREOF

FIELD OF THE INVENTION

The present invention is generally related to a method for manufacturing fine-pitch bumps, which particularly relates to the method for manufacturing fine-pitch bumps that prevents the copper ions from dissociation.

BACKGROUND OF THE INVENTION

In structure of fine-pitch bumps, a short phenomenon is easily occurred by a relatively short spacing between two adjacent copper bumps owing to the copper ion dissociated from the copper bump.

SUMMARY

The primary object of the present invention is to provide a method for manufacturing fine-pitch bumps comprising the following steps of providing a silicon substrate having a surface, a plurality of bond pads disposed at the surface and a protective layer disposed at the surface, wherein the protective layer comprises a plurality of openings, and the bond pads are revealed by the openings; forming a titanium-containing metal layer on the protective layer and the bond pads, the titanium-containing metal layer comprises a plurality of first zones and a plurality of second zones located outside the first zones; forming a photoresist layer on the titanium-containing metal layer; patterning the photoresist layer to form a plurality of opening slots corresponded to the first zones of the titanium-containing metal layer; forming a plurality of copper bumps at the first zones of the titanium-containing metal layer, each of the copper bumps comprises a first top surface and a first ring surface; heating the photoresist layer to ream the opening slots of the photoresist layer, and the heat process enables the photoresist layer to form a plurality of body portions and a plurality of removable portions; etching the photoresist layer to remove the removable portions and to reveal the titanium-containing metal layer, and each of the body portions comprises an inner lateral surface; forming a plurality of bump protection layers on the titanium-containing metal layer, the first top surface and the first ring surface of each of the copper bumps, wherein each of the bump protection layers comprises a metallic coverage portion and a bump coverage portion, the bump coverage portion comprises a second top surface and a second ring surface, the first top surface and the first ring surface of each of the copper bumps are covered with the bump coverage portion, the inner lateral surface of each of the body portions and the second ring surface are spaced apart from each other to define a gap; plating a plurality of gold layers at each of the gaps, the second top surface and the second ring surface of each of the bump coverage portions, and each of the gold layers comprises a third top surface; eventually, removing the body portions of the photoresist layer; removing the second zones of the titanium-containing metal layer to enable each of the first zones of the titanium-containing metal layer to form an under bump metallurgy layer located under each of the copper bumps, each of the under bump metallurgy layers comprises a bearing portion located under each of the copper bumps and an extending portion protruded to the first ring surface of each of the copper bumps, and the extending portion of each of the under bump metallurgy layers is covered with the metallic coverage portion of each of the bump protection layers. The bump protection layers and the gold layers being formed on the titanium-containing metal layer, the first top surface and the first ring surface of each of the copper bumps may prevent the copper ions within the copper bumps from dissociation to avoid a short phenomenon, which improves reliability of the fine-pitch bump structure effectively.

DETAILED DESCRIPTION OF THE INVENTION

Figure 1:
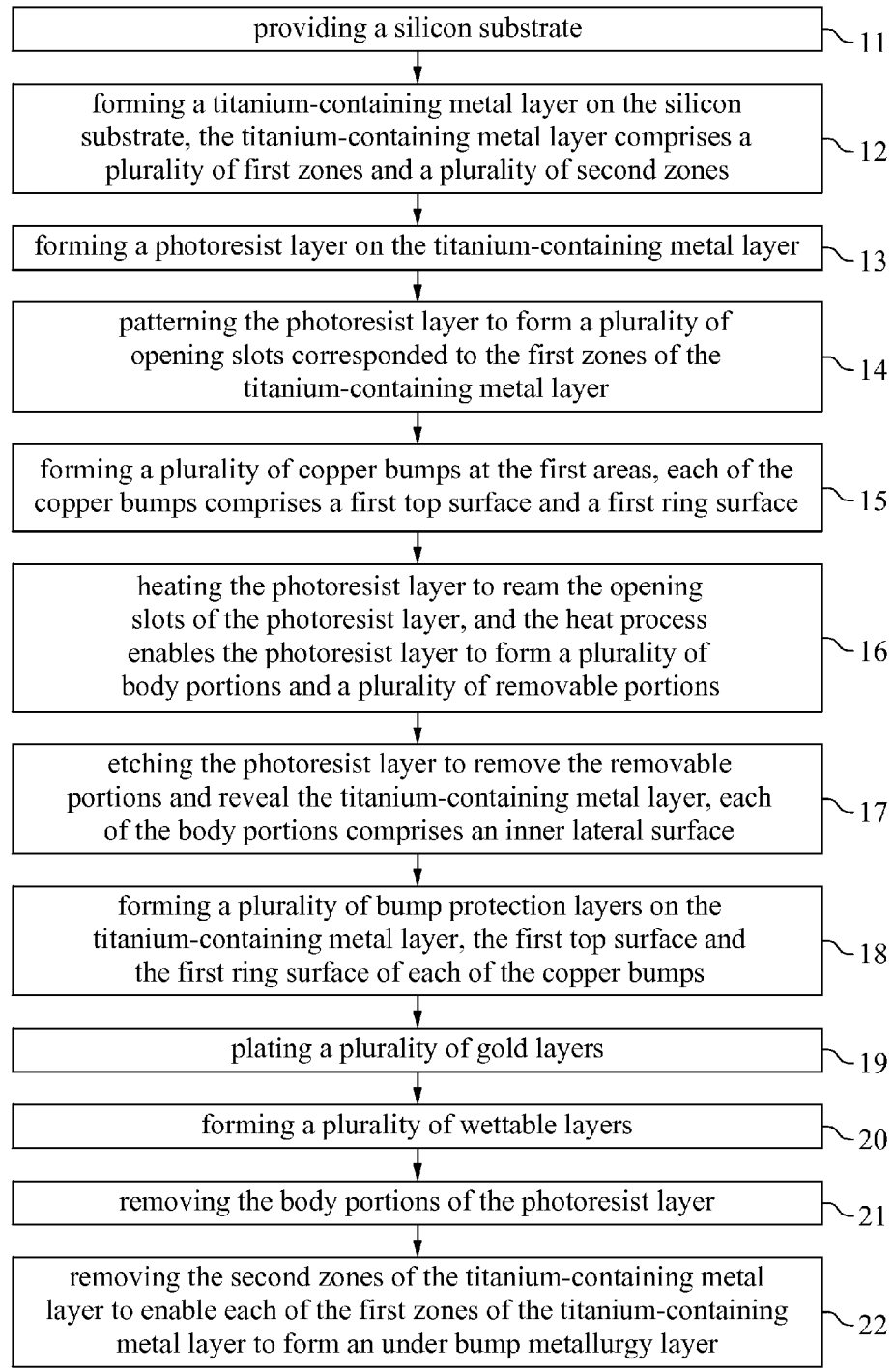
FIG. 1 is a flow illustrating a method for manufacturing fine-pitch bumps in accordance with a preferred embodiment of the present invention.
Figure 2A:
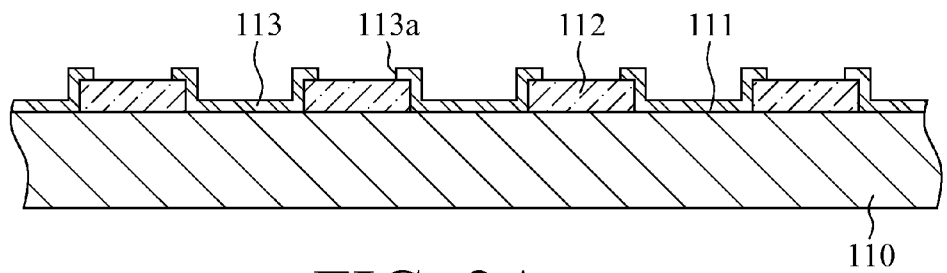
FIGS. 2A to 2L are sectional schematic diagrams illustrating a method for manufacturing fine-pitch bumps in accordance with a preferred embodiment of the present invention.
Figure 2B:
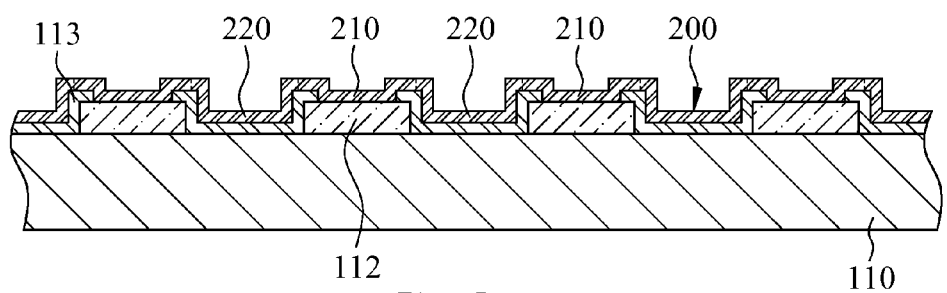
Figure 2C:
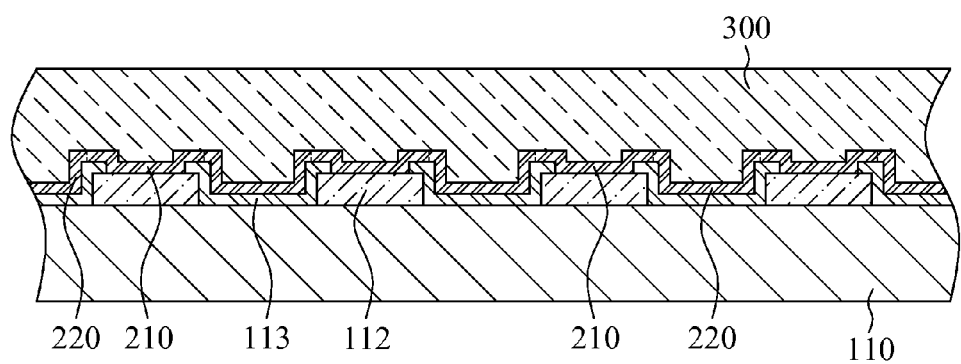
Figure 2D:
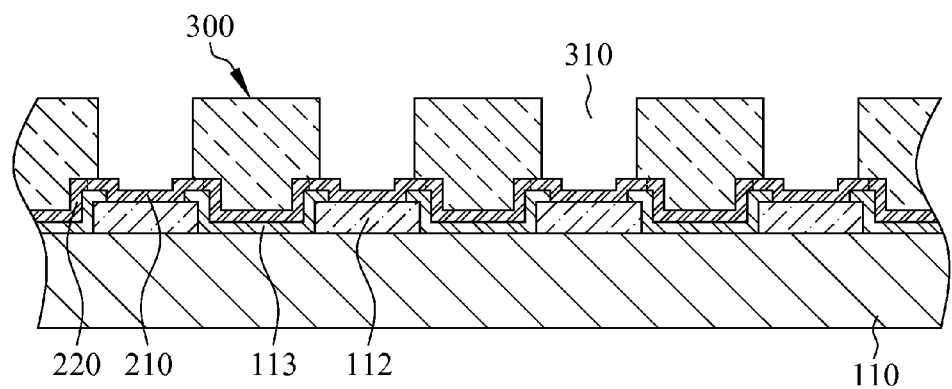
Figure 2E:
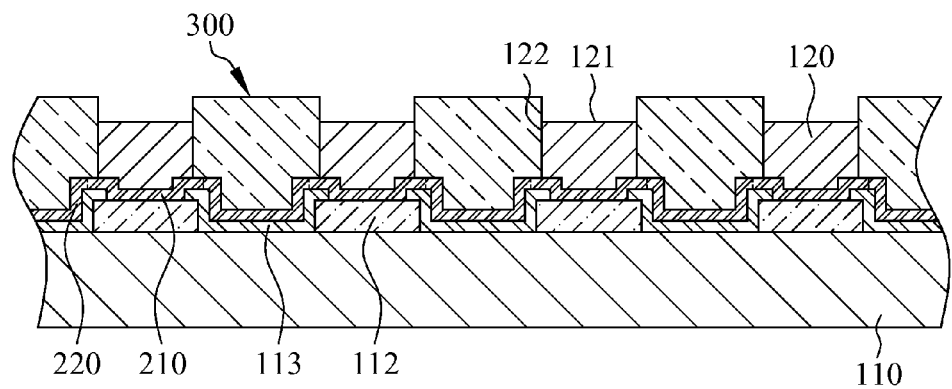
Figure 2F:
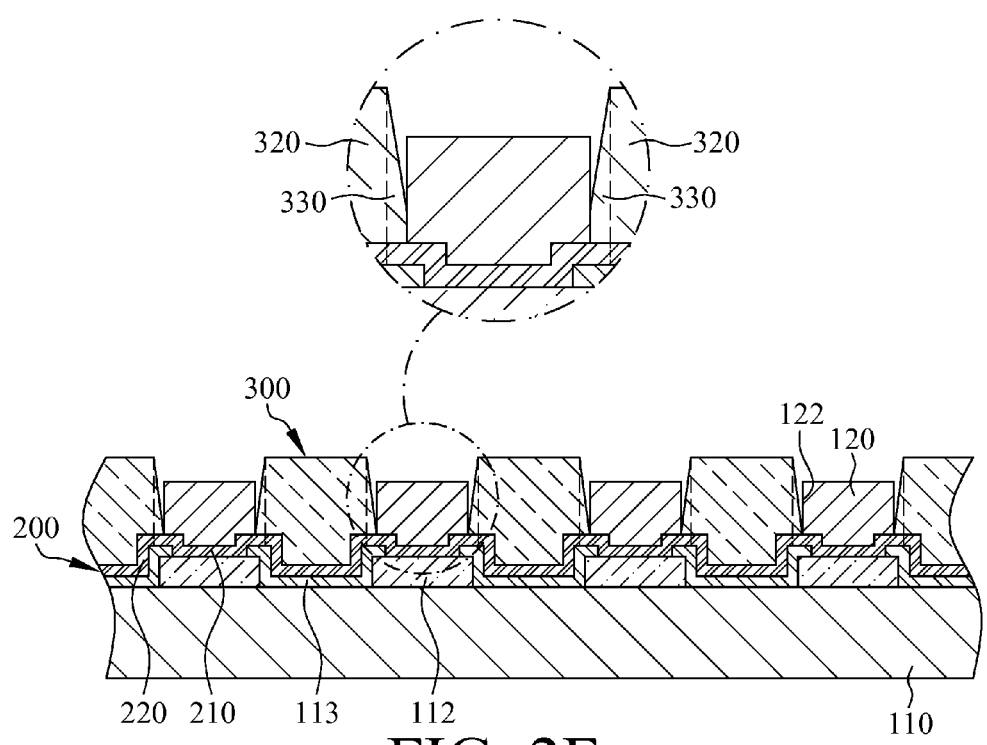

With reference to FIGS. 1 and 2A to 2L, a method for manufacturing fine-pitch bumps in accordance with a preferred embodiment of the present invention comprises the following steps of: first, with reference to step 11 of FIG. 1 and FIG. 2A, providing a silicon substrate 110 having a surface 111, a plurality of bond pads 112 disposed at the surface 111 and a protective layer 113 disposed at the surface 111, wherein the protective layer 113 comprises a plurality of openings 113a, and the bond pads 112 are revealed by the openings 113a; next, referring to step 12 of FIG. 1 and FIG. 2B, forming a titanium-containing metal layer 200 on the protective layer 113 and the bond pads 112, the titanium-containing metal layer 200 comprises a plurality of first zones 210 and a plurality of second zones 220 located outside the first zones 210; thereafter, referring to step 13 of FIG. 1 and FIG. 2C, forming a photoresist layer 300 on the titanium-containing metal layer 200; afterwards, referring to step 14 of FIG. 1 and FIG. 2D, patterning the photoresist layer 300 to form a plurality of opening slots 310 corresponded to the first zones 210 of the titanium-containing metal layer 200; then, referring to step 15 of FIG. 1 and FIG. 2E, forming a plurality of copper bumps 120 at the first zones 210 of the titanium-containing metal layer 200, each of the copper bumps 120 comprises a first top surface 121 and a first ring surface 122; next, referring to step 16 of FIG. 1 and FIG. 2F, heating the photoresist layer 300 to ream the opening slots 310 of the photoresist layer 300, and the heat process enables the photoresist layer 300 to form a plurality of body portions 320 and a plurality of removable portions 330, in this embodiment, the glass transition temperature in the heat process ranges from 70 to 140 degrees.

Figure 2G:
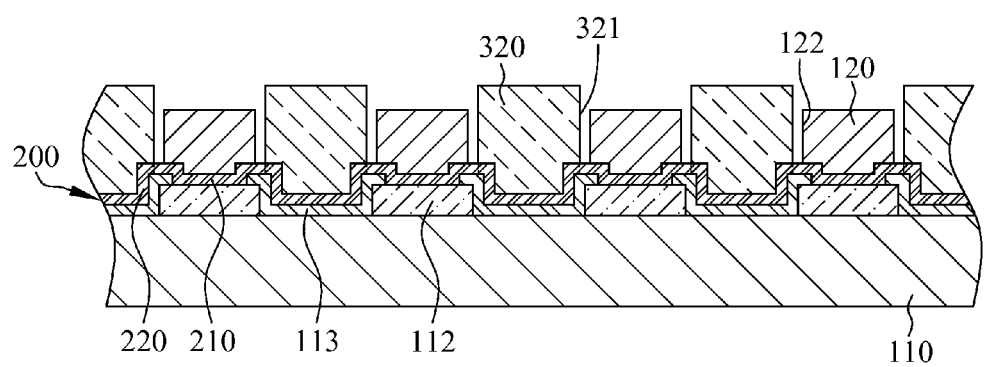
Figure 2H:
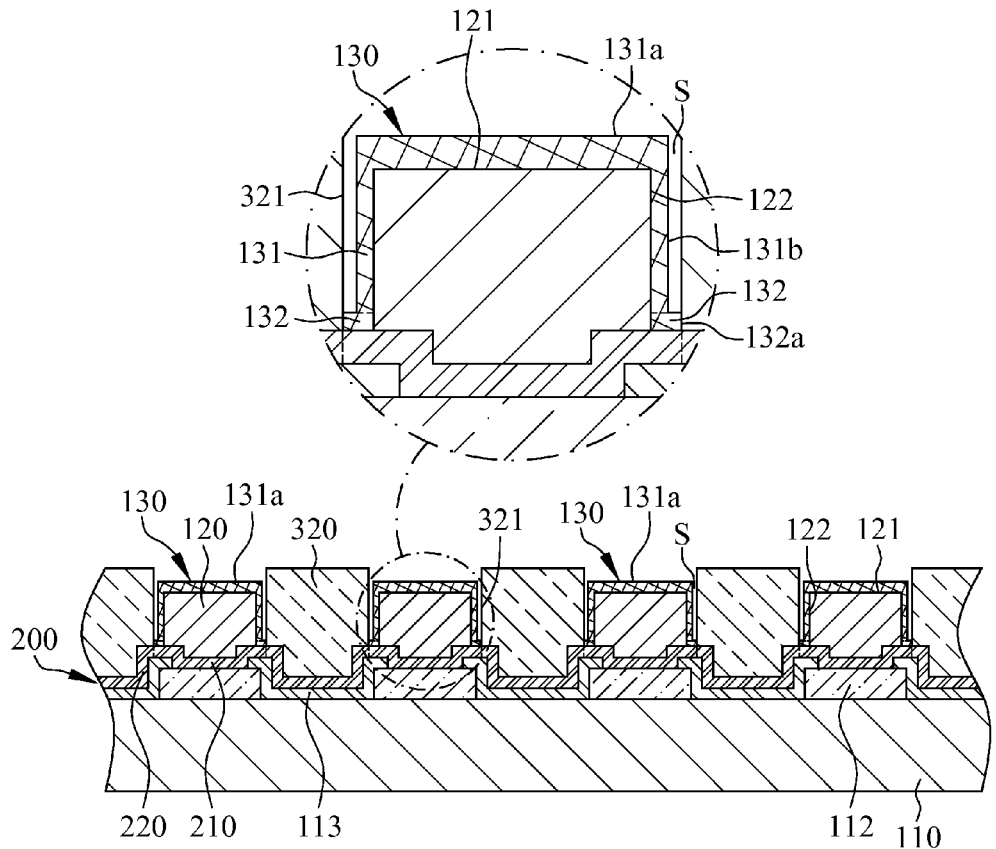
Figure 2I:
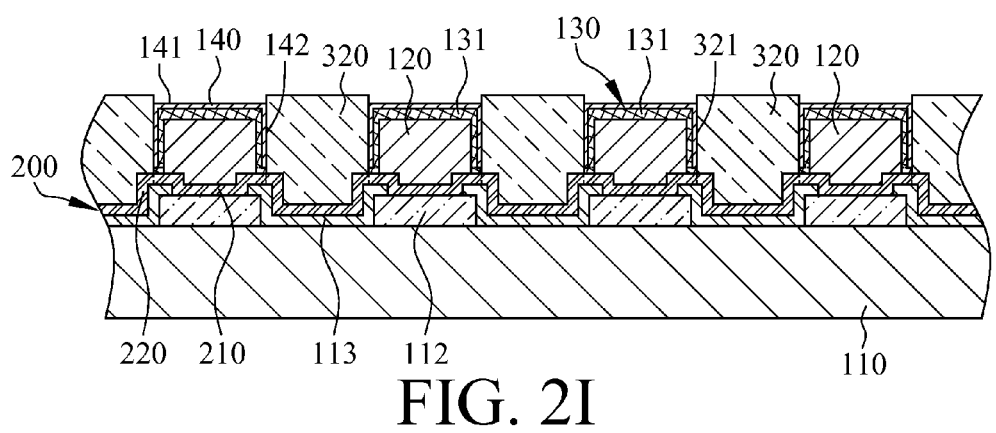
Figure 2J:
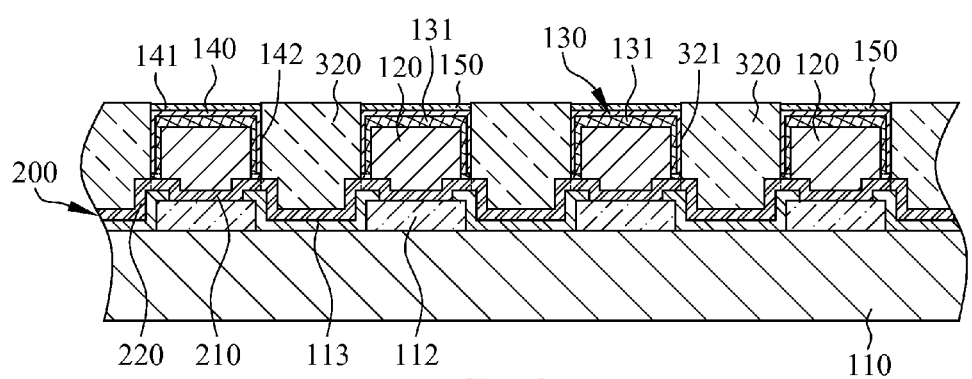

Next, referring to step 17 of FIG. 1 and FIG. 2G, etching the photoresist layer 300 to remove the removable portions 330 and reveal the titanium-containing metal layer 200, and each of the body portions 320 comprises an inner lateral surface 321, in this embodiment, the method for etching the photoresist layer 300 can be a method of plasma dry etching; thereafter, with reference to step 18 of FIG. 1 and FIG. 2H, forming a plurality of bump protection layers 130 on the titanium-containing metal layer 200, the first top surface 121 and the first ring surface 122 of each of the copper bumps 120, wherein each of the bump protection layers 130 comprises a metallic coverage portion 132 and a bump coverage portion 131, the bump coverage portion 131 comprises a second top surface 131a and a second ring surface 131b, the first top surface 121 and the first ring surface 122 of each of the copper bumps 120 are covered with the bump coverage portion 131, in this embodiment, the material of the bump protection layers 130 can be chosen from one of nickel, palladium or gold, the metallic coverage portion 132 is protruded to the second ring surface 131b of the bump coverage portion 131 and comprises a first outer lateral surface 132a, wherein the inner lateral surface 321 of each of the body portions 320 and the second ring surface 131b are spaced apart from each other to define a gap S; next, with reference to step 19 of FIG. 1 and FIG. 2I, plating a plurality of gold layers 140 at each of the gaps S, the second top surface 131a and the second ring surface 131b of each of the bump coverage portions 131, wherein each of the gold layers 140 comprises a third top surface 141 and a second outer lateral surface 142; afterward, referring to step 20 of FIG. 1 and FIG. 2J, forming a plurality of wettable layers 150 on the third top surfaces 141 of the gold layers 140.

Figure 2K:
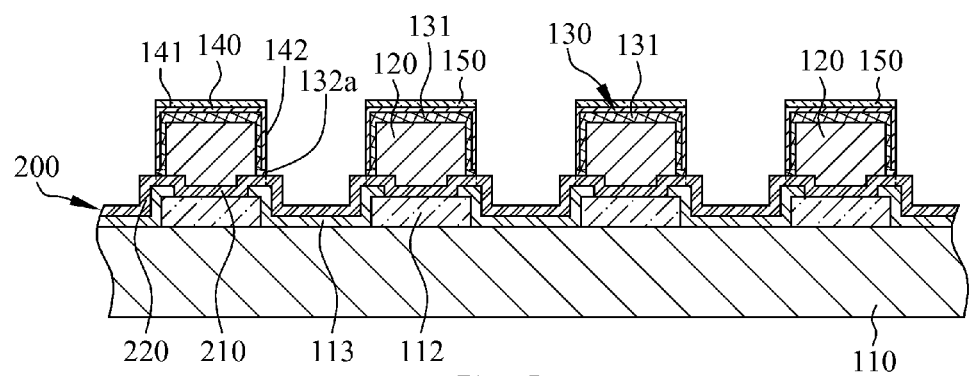
Figure 2L:
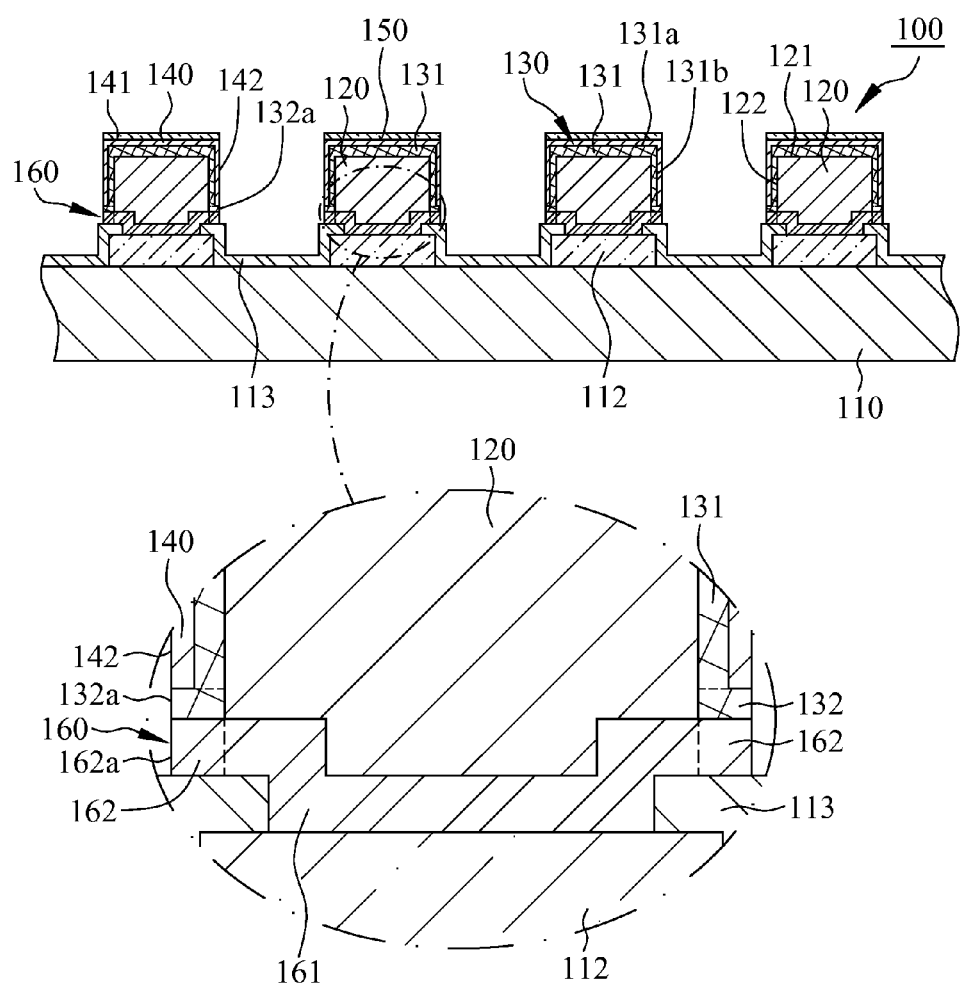

Next, referring to step 21 of FIG. 1 and FIG. 2K, removing the body portions 320 of the photoresist layer 300 to reveal the second zones 220 of the titanium-containing metal layer 200, the second outer lateral surfaces 142 of the gold layers 140, the wettable layers 150 and the first outer lateral surfaces 132a of the metallic coverage portions 132, in this invention, the second outer lateral surface 142 of each of the gold layers 140 is coplanar with the first outer lateral surface 132a of each of the metallic coverage portions 132; eventually, referring to step 22 of FIG. 1 and FIG. 2L, removing the second zones 220 of the titanium-containing metal layer 200 to enable each of the first zones 210 of the titanium-containing metal layer 200 to form an under bump metallurgy layer 160 located under each of the copper bumps 120, wherein each of the under bump metallurgy layers 160 comprises a bearing portion 161 located under each of the copper bumps 120 and an extending portion 162 protruded to the first ring surface 122 of each of the copper bumps 120, and the under bump metallurgy layers 160 are made of a material selected from one of titanium/tungsten/gold, titanium/copper and titanium/tungsten/copper. The extending portion 162 of each of the under bump metallurgy layers 160 is covered with the metallic coverage portion 132 of each of the bump protection layer 130, and the extending portion 162 of each of the under bump metallurgy layers 160 comprises a third outer lateral surface 162a coplanar with the first outer lateral surface 132a of each of the metallic coverage portions 132. The bump protection layers 130 and the gold layers 140 being formed on the titanium-containing metal layer 200, the first top surface 121 and the first ring surface 122 of each of the copper bumps 120 may prevent the copper ions within the copper bumps 120 from dissociation to avoid a short phenomenon, which improves reliability for the fine-pitch bump structure.

With reference to FIG. 2L again, a fine-pitch bump structure 100 in accordance with a preferred embodiment of the present invention at least comprises a silicon substrate 110, a plurality of under bump metallurgy layers 160, a plurality of copper bumps 120, a plurality of bump protection layers 130, a plurality of gold layers 140, and a plurality of wettable layers 150, wherein the silicon substrate 110 comprises a surface 111, a plurality of bond pads 112 disposed at the surface 111 and a protective layer 113 disposed at the surface 111. The protective layer 113 comprises a plurality of openings 113a, and the bond pads 112 are revealed by the openings 113a. The under bump metallurgy layers 160 are formed on the bond pads 112, each of the under bump metallurgy layers 160 comprises a bearing portion 161 and an extending portion 162, and the under bump metallurgy layers 160 are made of a material selected from one of titanium/tungsten/gold, titanium/copper and titanium/tungsten/copper. The copper bumps 120 are formed on the under bump metallurgy layers 160, and each of the copper bumps 120 comprises a first top surface 121 and a first ring surface 122. The bearing portion 161 of each of the under bump metallurgy layers 160 is located under each of the copper bumps 120, and the extending portion 162 of each of the under bump metallurgy layers 160 is protruded to the first ring surface 122 of each of the copper bumps 120. The bump protection layers 130 are formed on the extending portions 162 of the under bump metallurgy layers 160, the first top surface 121 and the first ring surface 122 of each of the copper bumps 120. Each of the bump protection layers 130 comprises a bump coverage portion 131 and a metallic coverage portion 132, wherein the bump coverage portion 131 comprises a second top surface 131a and a second ring surface 131b, and each of the metallic coverage portions 132 is protruded to the second ring surface 131b of the bump coverage portion 131 and comprises a first outer lateral surface 132a. The first top surface 121 and the first ring surface 122 of each of the copper bumps 120 are covered with each of the bump coverage portions 131, each of the extending portions 162 is covered with each of the metallic coverage portions 132, and the material of the bump protection layers 130 can be chosen from one of nickel, palladium or gold. The gold layers 140 are formed on each of the metallic coverage portions 132, the second top surface 131a and the second ring surface 131b of each of the bump coverage portions 131, wherein each of the gold layers 140 comprises a third top surface 141 and a second outer lateral surface 142 coplanar with the first outer lateral surface 132a of each of the metallic coverage portions 132. The wettable layers 150 are formed on the third top surfaces 141 of the gold layers 140. In this embodiment, the extending portion 162 of each of the under bump metallurgy layers 160 comprises a third outer lateral surface 162a coplanar with the first outer lateral surface 132a of each of the metallic coverage portions 132.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:
1. A method for manufacturing fine-pitch bumps at least comprising:
providing a silicon substrate having a surface, a plurality of bond pads disposed at the surface and a protective layer disposed at the surface, wherein the protective layer comprises a plurality of openings, and the bond pads are revealed by the openings;
forming a titanium-containing metal layer on the protective layer and the bond pads, the titanium-containing metal layer comprises a plurality of first zones and a plurality of second zones located outside the first zones;
forming a photoresist layer on the titanium-containing metal layer;
patterning the photoresist layer to form a plurality of opening slots corresponded to the first zones of the titanium-containing metal layer;
forming a plurality of copper bumps at the first zones of the titanium-containing metal layer, each of the copper bumps comprises a first top surface and a first ring surface;
heating the photoresist layer to ream the opening slots of the photoresist layer, and the heat process enables the photoresist layer to form a plurality of body portions and a plurality of removable portions;

etching the photoresist layer to remove the removable portions and reveal the titanium-containing metal layer, each of the body portions comprises an inner lateral surface;

forming a plurality of bump protection layers on the titanium-containing metal layer, the first top surface and the first ring surface of each of the copper bumps, wherein each of the bump protection layers comprises a metallic coverage portion and a bump coverage portion, the bump coverage portion comprises a second top surface and a second ring surface, the first top surface and the first ring surface of each of the copper bumps are covered with each of the bump coverage portions, and the second ring surface and the inner lateral surface of each of the body portions are spaced apart from each other to define a gap;

plating a plurality of gold layers at each of the gaps, the second top surface and the second ring surface of each of the bump coverage portions, and each of the gold layers comprises a third top surface;

removing the body portions of the photoresist layer; and removing the second zones of the titanium-containing metal layer to enable each of the first zones of the titanium-containing metal layer to form an under bump metallurgy layer located under each of the copper bumps, each of the under bump metallurgy layers comprises a bearing portion located under each of the copper bumps and an extending portion protruded to the first ring surface of each of the copper bumps, and the extending portion of each of the under bump metallurgy layers is covered with the metallic coverage portion of each of the bump protection layers.

2. The method for manufacturing fine-pitch bumps in accordance with claim 1,
wherein the method for etching the photoresist layer can be a method of plasma dry etching.

3. The method for manufacturing fine-pitch bumps in accordance with claim 1 further comprises a step of forming a plurality of wettable layers on the third top surfaces of the gold layers prior to the step of removing the body portions of the photoresist layer.

4. The method for manufacturing fine-pitch bumps in accordance with claim 1,
wherein each of the metallic coverage portions is protruded to the second ring surface of the bump coverage portion and comprises a first outer lateral surface.

5. The method for manufacturing fine-pitch bumps in accordance with claim 4,
wherein each of the gold layers further comprises a second outer lateral surface coplanar with the first outer lateral surface of each of the metallic coverage portions.

6. The method for manufacturing fine-pitch bumps in accordance with claim 4,
wherein the extending portion of each of the under bump metallurgy layers comprises a third outer lateral surface coplanar with the first outer lateral surface of each of the metallic coverage portions.

7. The method for manufacturing fine-pitch bumps in accordance with claim 1,
wherein a glass transition temperature in the heat process ranges from 70 to 140 degrees.

\* \* \* \* \*